United States Patent [19]

Jackson

[11] Patent Number: 4,656,632
[45] Date of Patent: Apr. 7, 1987

[54] SYSTEM FOR AUTOMATIC TESTING OF CIRCUITS AND SYSTEMS

[75] Inventor: Philip Jackson, Mahwah, N.J.

[73] Assignee: Giordano Associates, Inc., Sparta, N.J.

[21] Appl. No.: 555,287

[22] Filed: Nov. 25, 1983

[51] Int. Cl.[4] ............................................. G01R 31/28
[52] U.S. Cl. .................. 371/20; 324/73 AT; 364/580; 371/25
[58] Field of Search ................... 371/25, 20; 364/579, 364/580; 324/73 R, 73 AT

[56] References Cited

U.S. PATENT DOCUMENTS

| | | | |
|---|---|---|---|
| 3,657,527 | 4/1972 | Kassabgi et al. | 371/25 |
| 3,714,571 | 1/1973 | Walker | 371/25 X |
| 3,832,535 | 8/1974 | DeVito | 371/20 |
| 3,854,125 | 10/1974 | Ehling et al. | 364/200 |
| 3,922,537 | 11/1975 | Jackson | 371/20 |
| 3,976,940 | 8/1976 | Chau et al. | 324/73 R |
| 4,000,460 | 12/1976 | Kadakia et al. | 324/73 R |
| 4,044,244 | 8/1977 | Foreman et al. | 371/20 |
| 4,055,801 | 10/1977 | Pike et al. | 324/73 R |
| 4,102,491 | 7/1978 | De Vito et al. | 371/20 |
| 4,155,116 | 5/1979 | Tawfik et al. | 371/20 X |
| 4,168,527 | 9/1979 | Winkler | 364/580 |
| 4,313,200 | 1/1982 | Nishiura | 371/25 |

OTHER PUBLICATIONS

Jackson, Philip C., "Evolutionary Trends In Pin Electronics", IEEE Publication No. CH 1488-6/79/00-00-0018 (1979), pp. 18-22.
Research and Development Technical Report GECOM-81-0146-F "Universal Pin Electronics", Sep., 1982.

Primary Examiner—Charles E. Atkinson
Attorney, Agent, or Firm—Amster, Rothstein & Ebenstein

[57] ABSTRACT

A Universal Pin Electronics ("UPE") System is disclosed which incorporates a plurality of testing channels, each of which is coupled to a single input pin of a unit under test and is capable of selectively generating a plurality of different types of stimuli and applying the same to the single pin of the unit under test. The test channels are also coupled to a single output pin of the unit under test and are capable of receiving an induced output from the unit being tested. Test channels may be coupled to a common single pin of the unit under test which pin is capable of functioning as a bidirectional pin. In a preferred embodiment, each test channel has the capability of selectively generating functional digital, parametric digital and analog stimuli, applying the same to a pin of the unit under test, and receiving the output of the same or a different pin and comparing it with the expected output or storing it. The test channel includes a local memory which receives and stores digital information corresponding to functional digital, parametric digital, and analog stimuli to be generated by the test channel. The digital information is loaded into the local memory under control of a local microcontroller. The local memory is large enough to store a substantial quantity of digital information without replenishment so that the test channel is capable of conducting relatively extensive testing with respect to the pin of the unit under test to which it is coupled. The local memory can store compacted data and the UPE can include a decompaction circuit. Each UPE test channel can accomplish at its associated pin, without switching: functional digital stimulus generation; functional digital measurement; functional digital stimulus generation and measurement; parametric digital stimulus generation; parametric digital measurement; analog stimulus generation; and analog measurement.

22 Claims, 14 Drawing Figures

DETAILED OVERALL BLOCK DIAGRAM

ANALOG, PARAMETRIC DIGITAL SIGNAL FLOW

ANALOG, PARAMETRIC DIGITAL SIGNAL FLOW

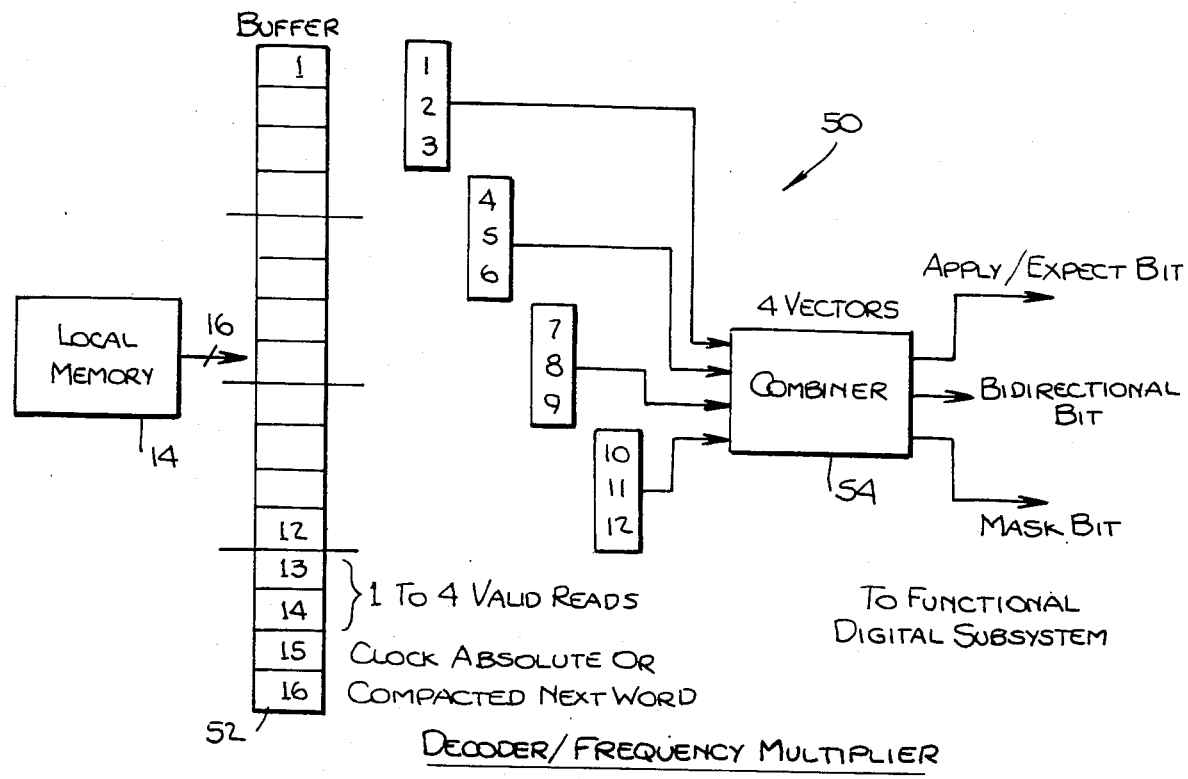
Fig. 3. Decoder/Frequency Multiplier
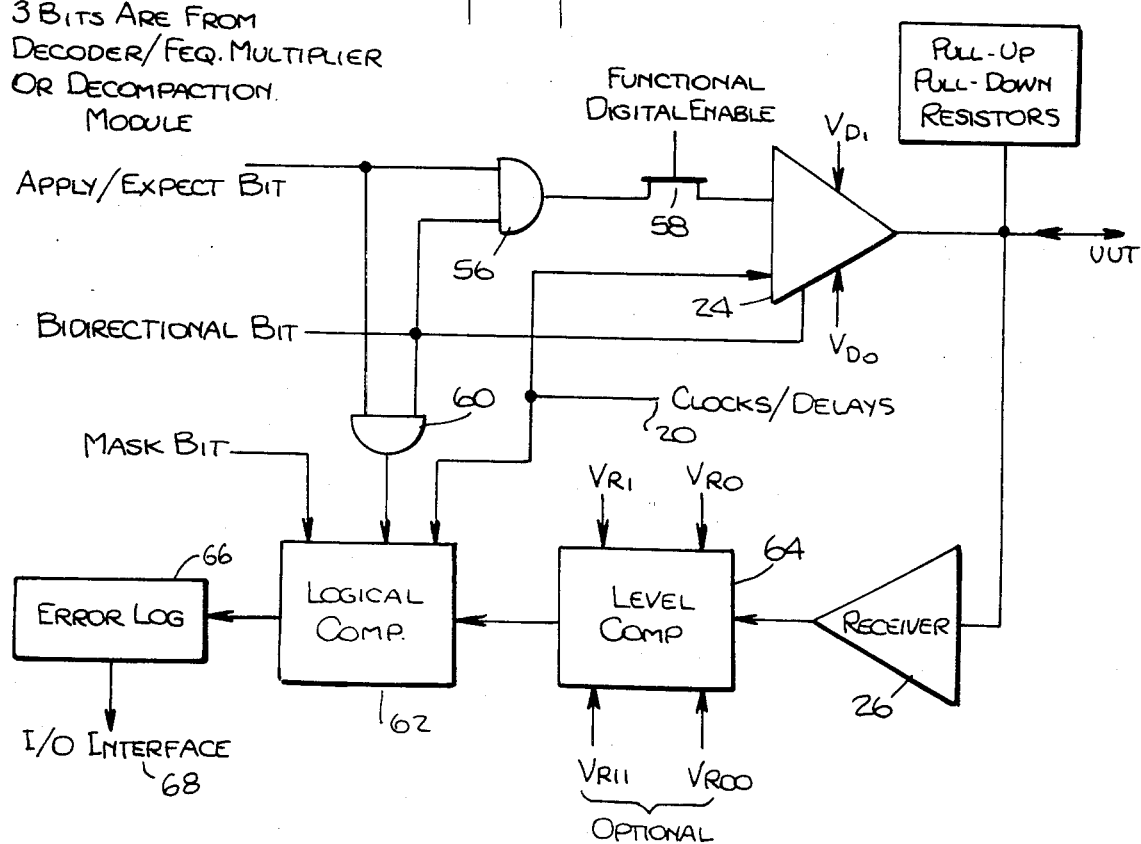
Fig. 4. Functional Digital System

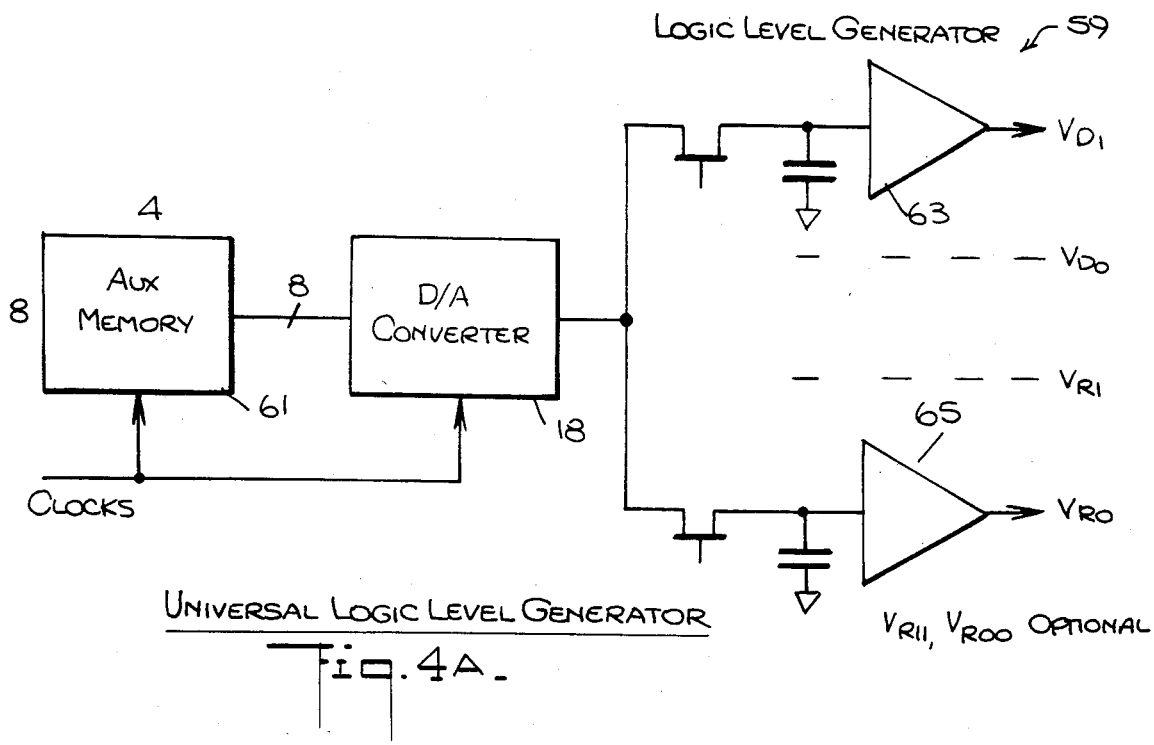
Fig. 4A. Universal Logic Level Generator
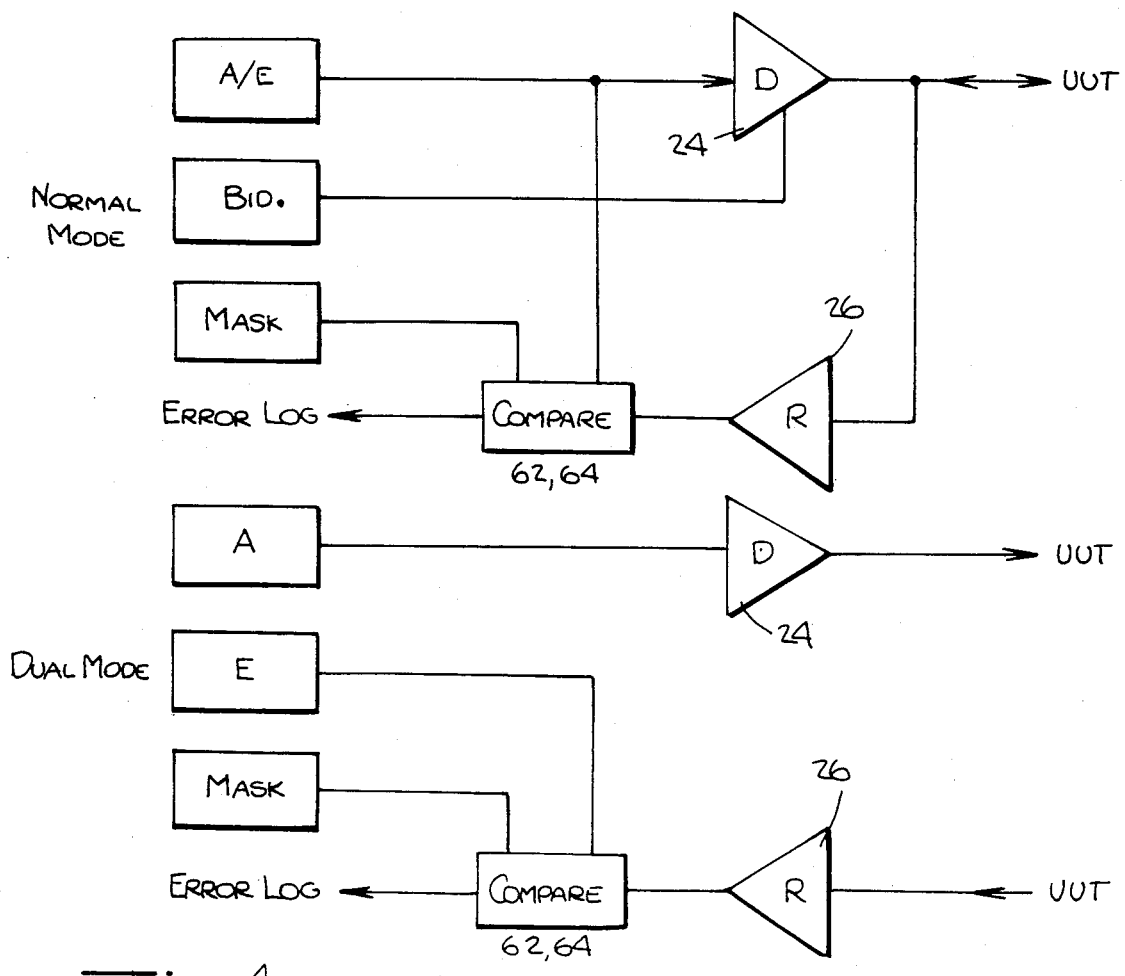
Fig. 4B. Channel Modes

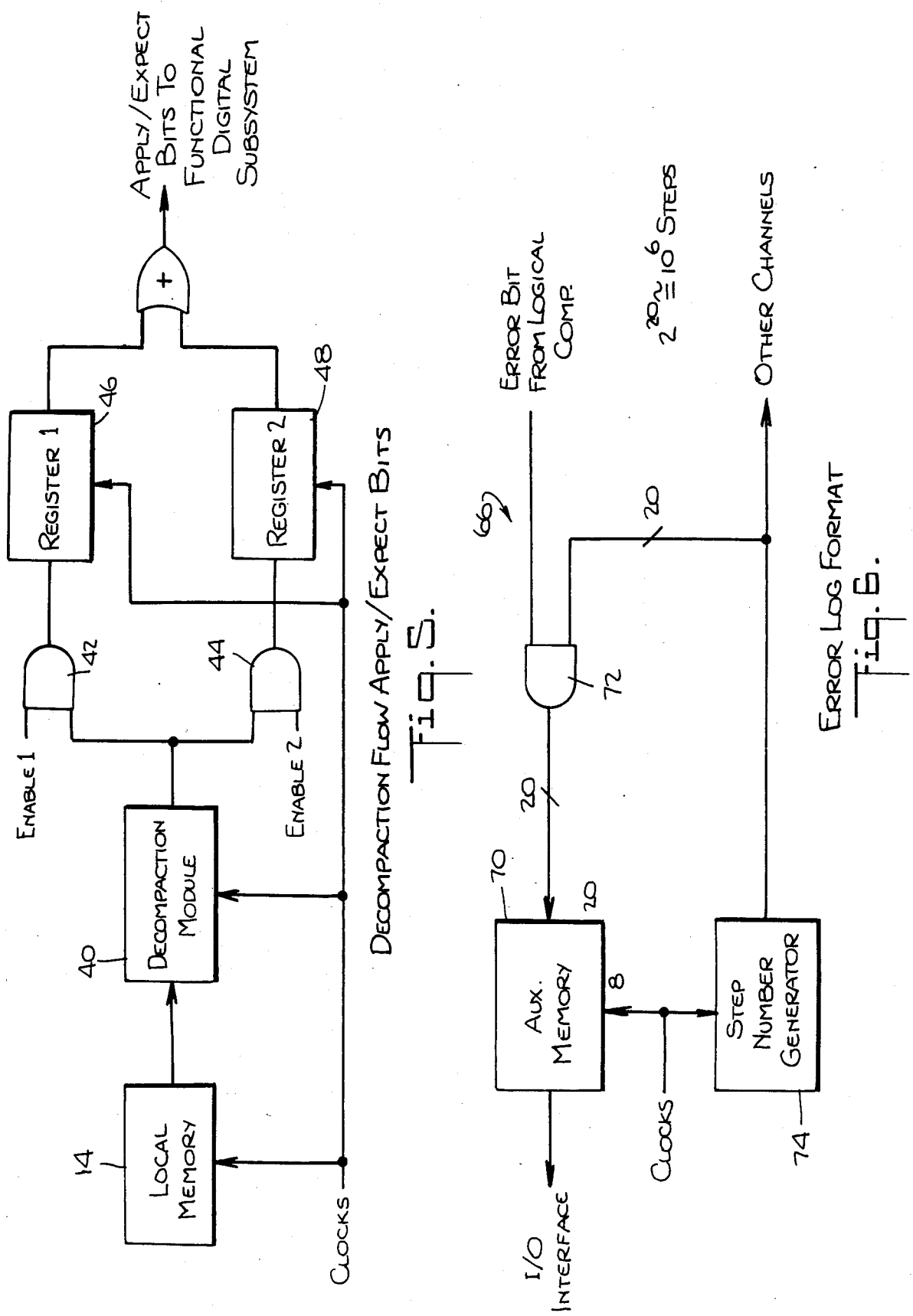

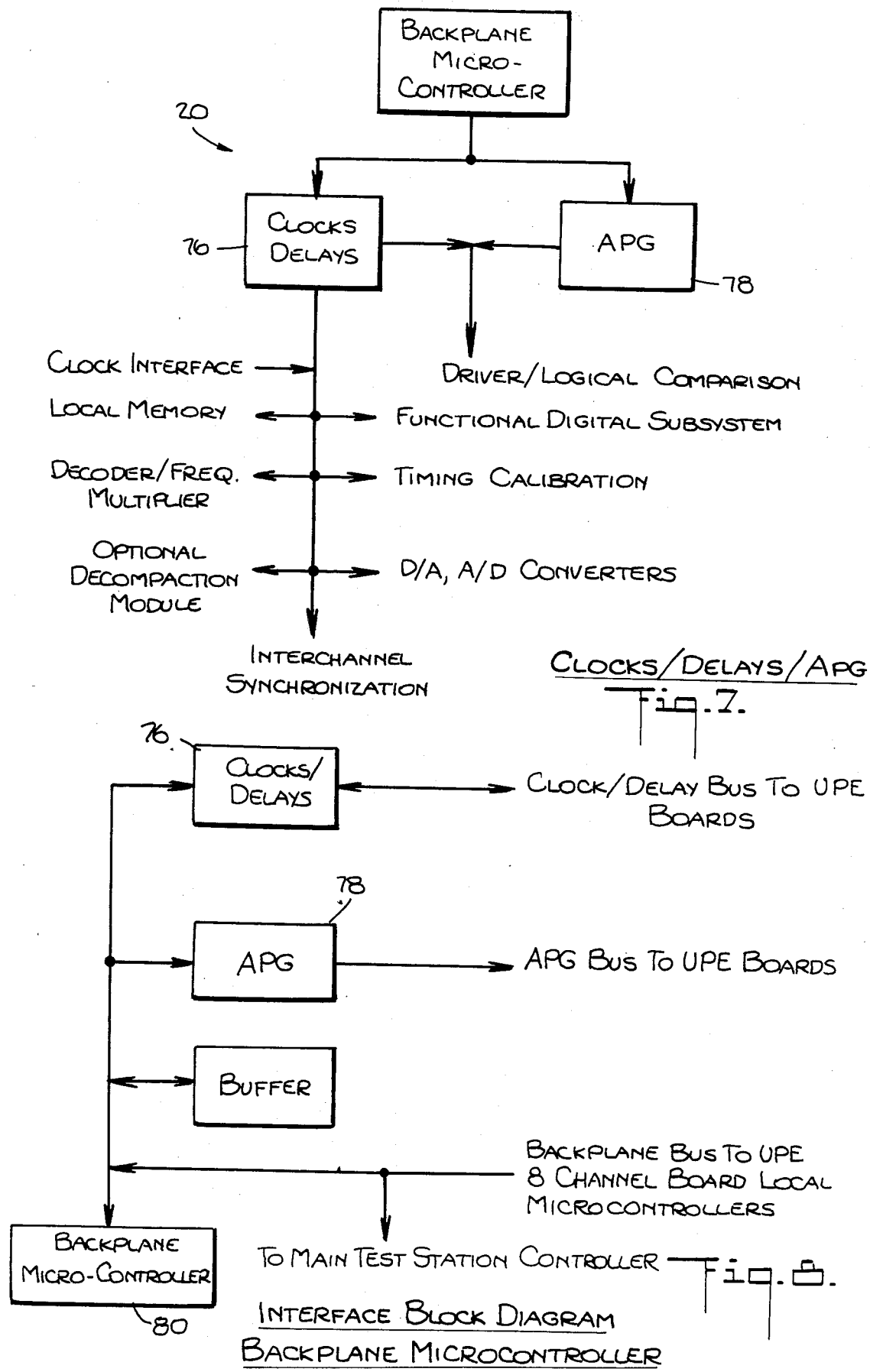

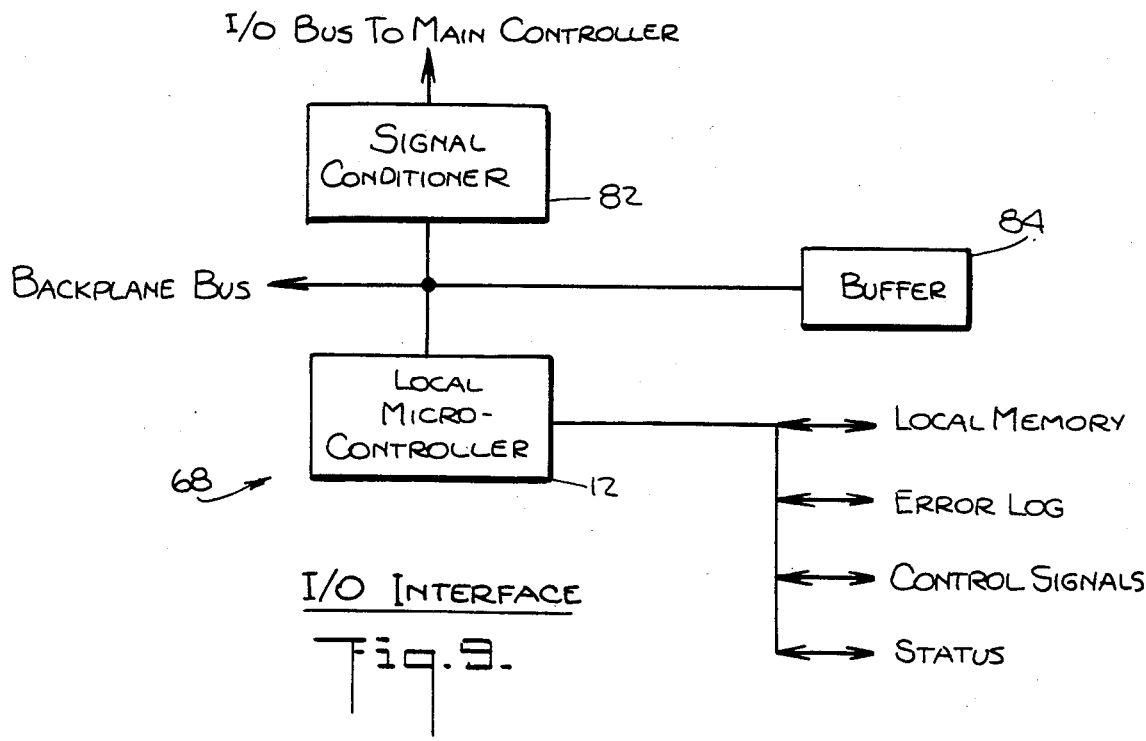
Fig. 9. I/O Interface
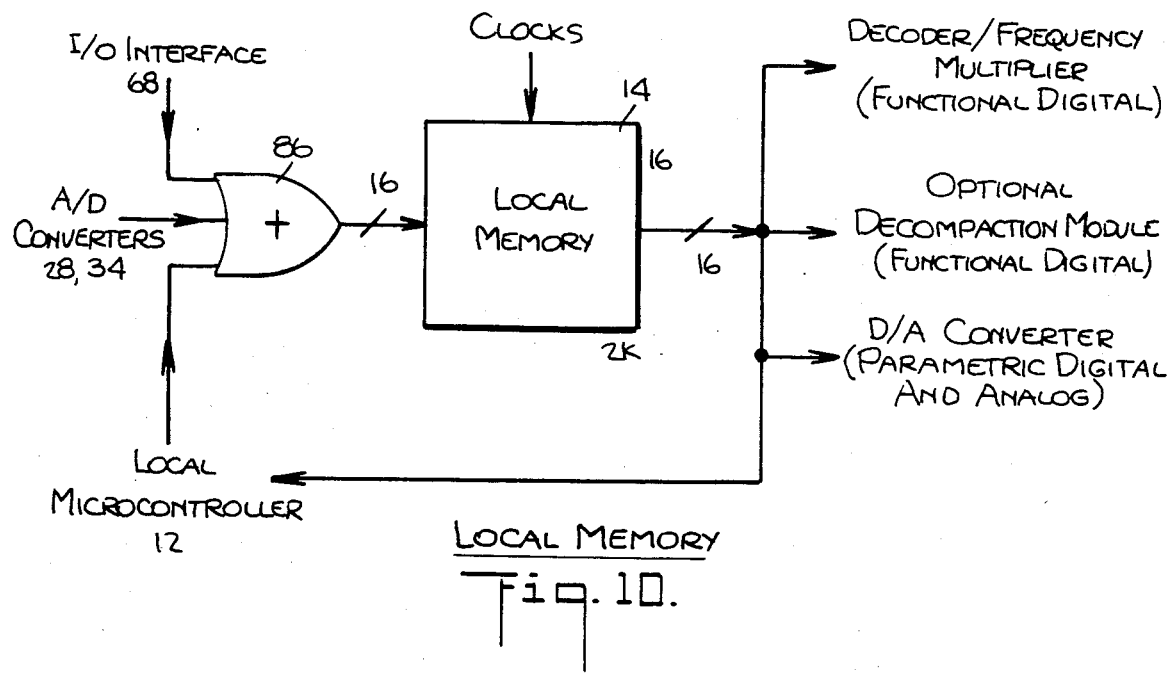
Fig. 10. Local Memory
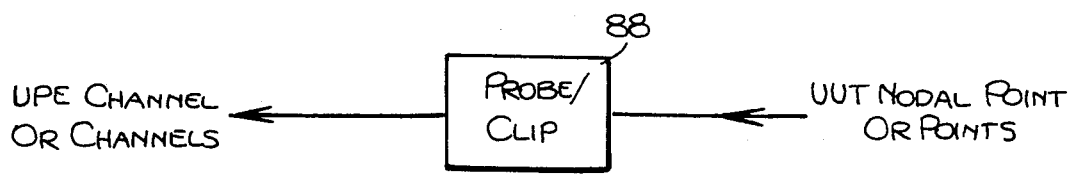
Fig. 11. Guided Probe/Clip Signal Flow

SYSTEM FOR AUTOMATIC TESTING OF CIRCUITS AND SYSTEMS

This invention was made with Government support under Contract Number DAAK 80-81-C-0146 awarded by the U.S. Army Communications—Electronics Command. The Government has certain rights in this invention.

The present invention relates generally to an automated system for testing integrated circuits, electronic printed circuit boards and systems, each of which has a plurality of pins, and relates specifically to such an automated testing system which provides a distinct and complete channel for testing the characteristics of each such pin.

The proliferation of integrated circuits in a wide variety of applications has led to a concomitant need for methods and apparatus to test the same and to do so in an effective and efficient manner. The principal approach, defined as functional digital testing, which has been used in the past to test such integrated circuits has been to apply a digital pattern (i.e., a series of ones and zeros) to the input pins of the unit under test ("UUT") while monitoring the induced response at the output pins of the UUT. The rate at which such tests were performed was governed by the rate at which the test system was able to process input and output information, a speed not significantly slower than the speed in which earlier units under test operated in actual circuit environments.

The increased use of medium scale integration ("MSI") and large scale integration ("LSI"), and therefore the density with which such components could be integrated into single units has made it necessary to develop test systems which could more closely simulate the higher speeds at which the units would actually operate. In addition, it has become necessary to test integrated circuits for their response not only to simple digital inputs, but rather to a full range of analog inputs, including complex wave forms, etc.

It is therefore an object of the present invention to provide a test system for integrated circuits, electronic printed circuit boards and systems which can test at approximately the rate at which the units will operate in their actual circuit environments.

It is yet another object of the present invention to provide such a test system which will permit testing UUTs which require functional digital, analog and other types of input.

It is a further object of the present invention to provide such a system with high reliability in a small physical package and at an economically feasible cost.

In accordance with the present invention, there is provided a system for automatic testing of integrated circuits known as the Universal Pin Electronics ("UPE") System. The UPE system incorporates a plurality of channels, each of which is capable of selectively generating functional digital, analog or parametric digital stimuli and applying the same to a pin of the UUT, measuring the output of a UUT pin and comparing the same with expected pin output, or performing both stimulus and measurement functions on a given pin, as determined by the user provided software.

These and other objects and features of the present invention can best be appreciated by reference to a presently preferred, but nonetheless illustrative, embodiment as shown in the accompanying drawing in which:

FIG. 3 is a block diagrammatic representation of the decoder/frequency multiplier which operates when the test channel is in the functional digital mode;

FIG. 4 is a block diagrammatic representation of the functional digital subsystem which operates when the test channel is in the functional digital mode;

FIG. 4A is a block diagrammatic representation of the universal logic level generator which operates in conjunction with the functional digital subsystem;

FIG. 4B shows the normal and dual mode capabilities of the functional digital subsystem;

FIG. 5 is a block diagrammatic representation showing the information flow in connection with the optional decompaction module;

FIG. 6 is a diagrammatic representation showing the error log formats and flow;

FIG. 7 is a block diagrammatic representation of the clock/delay and algorithmic pattern generator ("APG") subsystem;

FIG. 8 is a block diagrammatic representation of the input/output interface between the backplane microcontroller and the local microcontrollers of the individual test channels;

FIG. 9 is block diagrammatic representations of the interface arrangement of the backplane and local microcontrollers;

FIG. 10 is a block diagrammatic representation of the local memory function of a single test channel; and FIG. 11 is a block diagrammatic representation of the guided probe signal flow.

Figure 1:
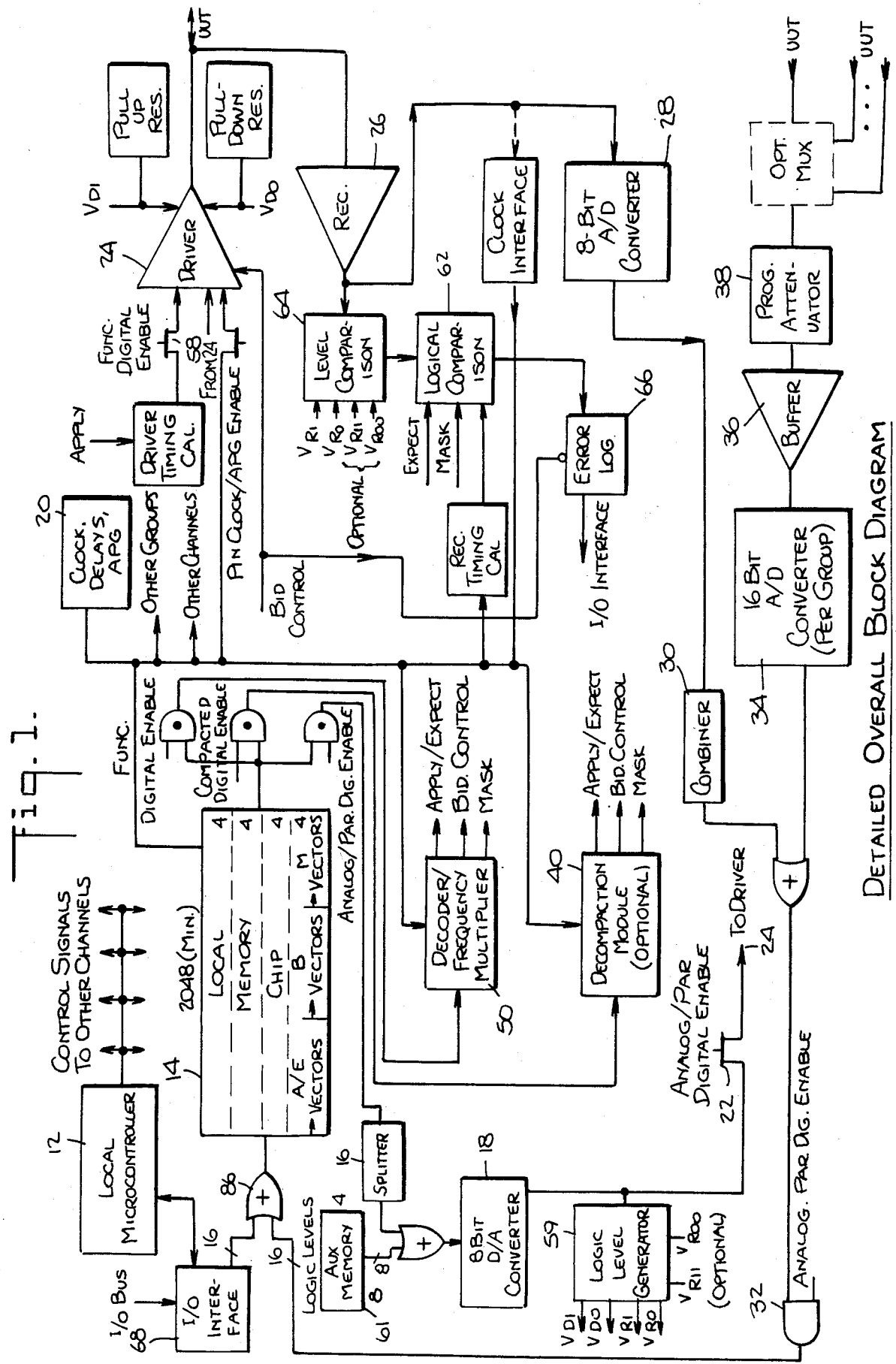
FIG. 1 is a detailed overall block diagram of a single test channel, representing the several elements of the present invention.

Turning to the drawing, and in particular to FIG. 1, the UPE system to be applied to each channel of a UUT is generally designated by the reference numeral 10. UPE system 10 is capable of six categories of functions, namely, providing analog, functional digital and parametric digital stimulus, and conducting analog, functional digital and parametric digital measurements. A description of these functions will facilitate an understanding of the system architecture.

Figure 2:
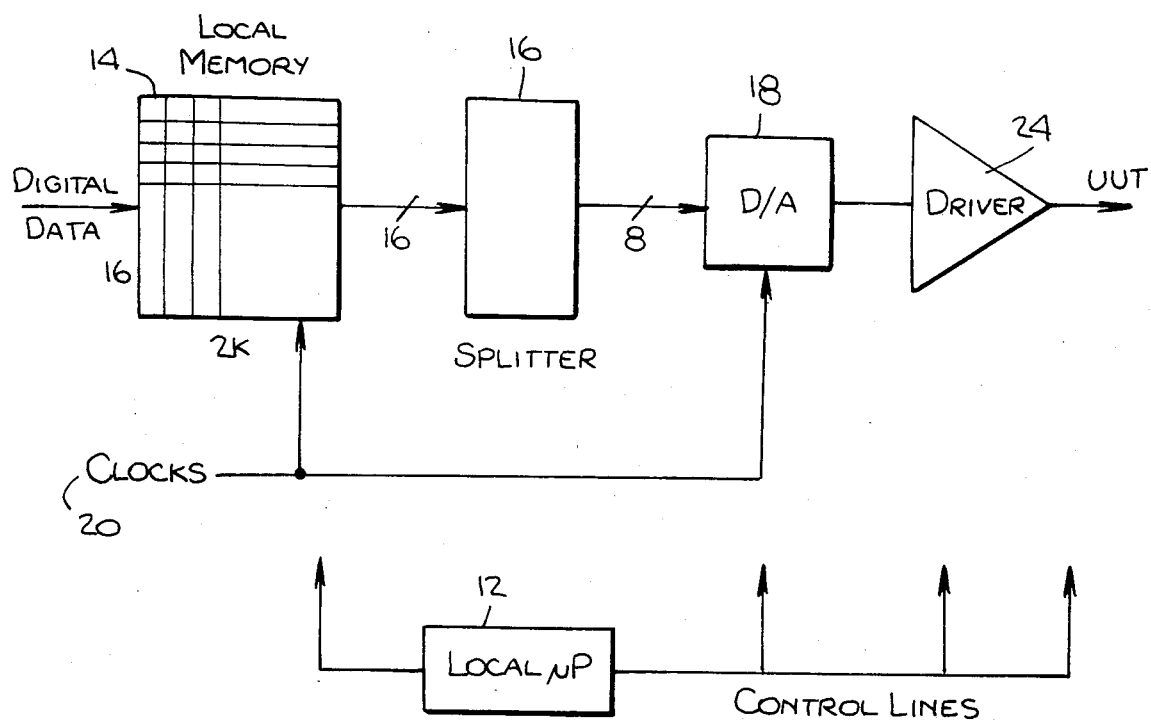
FIGS. 2 and 2A are block diagrammatic representations of the analog and parametric digital signal flow to and from a UUT, respectively.

Analog signals (e.g. sine waves, ramps, etc.) are those in which amplitude, frequency, etc. may vary with time. The parametric digital function involves the generation and measurement of various parameters of a waveform, e.g. amplitude, pulse width, rise time, etc. System 10 generates analog and parametric digital signals as shown in detail in FIG. 2.

At the instigation of local microcontroller 12 (see FIG. 1), local memory 14 generates the equivalent desired waveform in the form of simple 16-bit digital words (at a memory read rate of 30 MHz) each of which in turn is applied to splitter 16. Eight bits of data at a time are applied as the input to 8-bit D/A converter 18 (maximum rate 60 MHz) which along with the local memory 14 is timed by clock system 20. The output from D/A converter 18 is either in the form of a parametric digital waveform or an analog waveform (maximum rate 20 MHz) depending on the system software, and, with enable switch 22 on the output of D/A converter 18 is applied through driver 24 to the UUT.

Figure 2A:
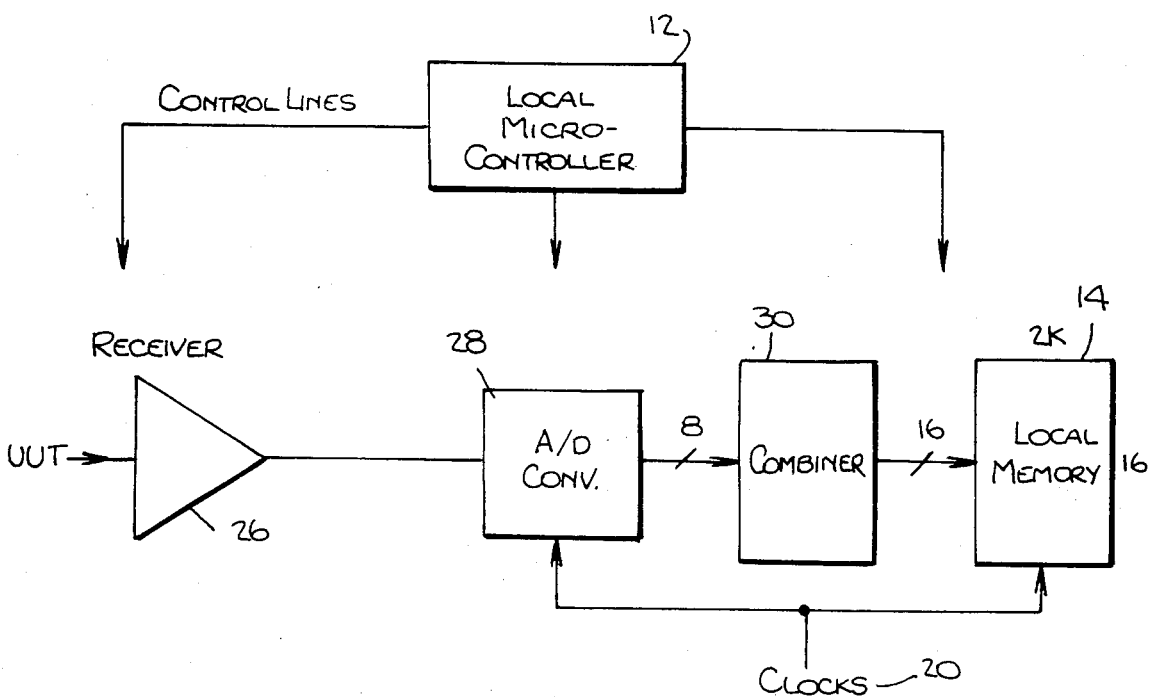

The measurement of analog and parametic digital waveforms from the UUT may be described by reference to FIG. 2A.

The output of the UUT is applied to receiver 26, the output of which is applied to 8-bit A/D converter 28 which is timed by clock system 20. Two 8-bit segments are concatenated to form a single 16 bit word for data processing purposes by combiner 30. This 16 bit word is strobed by the use of enable gate 32. (See FIG. 1). Because local memory 14 has 2K 16-bit words, the equivalent of 4K words of 8-bit storage is realized. Because A/D converter 28 operates at 60 MHz, the UPE system channel inputs data to local memory 14 at the effective rate of 30 mhz. Using this approach whereby the two 8-bit segments are concatenated into a single 16-bit word (known as a ping pong approach) the UPE channel can utilize a reasonably slow local memory 14.

Alternatively, for selective high resolution measurements, 16-bit A/D converter 34 may be employed in combination with buffer 36 and attenuator 38, in place of 8-bit A/D converter 28 and combiner 30. (See FIG. 1).

The measurement architecture described above eliminates the need for setting a trigger level to measure the output of the UUT. Instead, conversion via A/D converters 28, 34 is continuous; a snapshot (i.e., measurement) is taken only when the desired waveform is located in local memory 14.

Functional digital signals are conventional binary words. The generation of functional digital stimuli and the measurement of functional digital UUT outputs may best be understood by reference to the digital word formats used by the system of the present invention.

The basic (or absolute) format for the functional digital mode is a 16-bit word, in which bits 1, 2 and 3 represent a 3-bit vector including an apply/expect bit, a bidirectional bit and a mask bit respectively; as will be described below. Bits 4, 5 and 6 represent a second comparable 3-bit vector as do bits 7, 8, 9 and bits 10, 11 and 12. Bits 13 and 14 define the number of vectors (1 through 4) to be employed for a specific word; and bits 15 and 16 define the status of the next word in sequence, i.e., whether it also will be in basic format, or whether it will be in one of the optional forms which will be described below. The basic format words are applied to decoder/-frequency multiplier 50 as shown in FIG. 3.

Multiplier 50 includes buffer register 52 which receives the 16-bit words in the basic word format. The first twelve bits of the output of buffer register 52 constitute the four 3-but vectors and are grouped together by combiner 54 and then applied to the functional digital subsystem as well be described by reference to FIG. 5.

In the optional compacted mode, the first 3 bits of the 16 bit memory word define one of eight patterns of compacted data. The first such pattern might be all ones, the second might be all zeros, the third might be alternate ones, the third might be alternate ones and zeros starting with ones, etc. Bits 4 through 15 define the maximum count for the pattern defined by the first 3 bits. Since there are 11 bits in this group it is possible to define up to 2048 counts. Finally, the last two bits again define the format of the next word.

When the data is extracted from the local memory in compacted form, it is directed to decompaction module 40 (see FIG. 5). Decompaction module 40 takes the compacted data, decompacts it (e.g. converts it to basic format) and alternately strobes it into two registers 46,48. Two of registers 46, 48 are devoted to the apply/expect pattern, a comparable pair (not shown) are devoted to the bidirectional pattern, and two more (also not shown) to the mask pattern. Using the apply/expect bit as an example, when the compacted data is decoded into absolute form by decompaction module 40, it is strobed into a first (e.g. 46) of the two apply/expect registers 46, 48, with the second word in sequence being strobed into a second register 48. As soon as first register 46 empties (as its absolute data output is strobed to the UUT), it generates an interrupt telling decompaction module 40 to take another word from memory, decompact it, and refill register 46. All of this is possible from a timing standpoint because the second apply/expect register 48 is being utilized to transmit a word during this period of time. In a similar fashion the bidirectional and mask codes are decompacted. Optional decompaction module 40 is an important factor in increasing the maximum repetition rate and increasing overall test throughput.

Where functional digital stimuli are to be provided, whether the basic or compacted word formats are to be used, the 3 bits from each vector (apply/expect, bidirectional and mask) are applied to the functional digital subsystem as shown in FIG. 4.

If the UUT pin under consideration is of the input only type, then apply data is valid; if it is of the output only type, then only expect data is valid; and if it is a tristate bus, apply/expect data is interspersed on the same line, and the bidirectional bit is used to control data flow. The mask bit is used to screen out the "don't care" situations often encountered in testing.

Referring to FIG. 4, the apply/expect line applies a stimulus bit through gate 56 and, when gate 58 is enabled, to driver 24 and then to the UUT. The apply/expect line may also be used to enable and gate 60 and in turn logical comparator 62 which will compare the expected output from the UUT to actual UUT output (as directed through receiver 26). If bus-type testing is being performed, both functions are interspersed in real time.

Because it is common for UUTs to include multiple logic families (ECL, TTL, etc.) it is important to provide programmable levels of test stimuli to correspond to these multiple logic levels. The UPE system constructed in accordance with this invention achieves this capability by use of logic level generator 59 as shown in FIG. 4A. Logic level generator 59 includes auxiliary memory 61 which permits a series of 8-bit words to be stored and transferred to D/A converter 18 when it is to generate such changed logic levels. This 8-bit word is converted by D/A converter 18 into a voltage level, and strobed or clocked via a multiplexer into buffer amplifiers 63,65. Four output levels are thus generated, namely: the logic levels zero and one for driver 24 (Vdo, Vd1) and the logic levels zero and one for receiver 26 (Vro, Vr1). Optionally, two additinal levels could be provided to separate by two levels the receiver logical one and the receiver logical zero (Vrii and Vroo).

A typical output bit stream from the UUT (See FIG. 4) would be buffered through receiver 26, and compared at level comparator 64 against the desired logic voltage level (as programmed by the software). The received bit is compared with the expected bit at logical comparitor 62 (or masked in a "don't care" situation), entered into error log 66 and thence to I/O interface 68. In the case of a bus-type UUT pin (i.e., one which may transmit data in a bidirectional sense), the bidirectional bit is applied to driver 26, to place it in a low impedance drive state or a high impedance state so that receiver 26 can monitor the UUT output.

Optionally, one channel of the UPE system can be used in a dual mode to apply both a functional digital input to the UTT and to monitor UUT output (See FIG. 4B).

The operation of the error log will now be described by reference to FIG. 6. Investigation of former techniques demonstrated that it is most effective to trace the earliest error which appears. An auxiliary memory 70 is used to store such errors, by test step. An error bit from the logical comparator 62 is anded at gate 72 with the sequential output of step number generator 74 corresponding to the UUT test which produced the error bit recorded in memory 70.

The third word format is applicable to all signal types and permits the generation of algorithmic patterns as stimuli to the UUT via driver 24 in the clock-/delay/APG format. In this format, the first three bits define the use of one of 7 clocks 76 or the algorithmic pattern generator 78 (APG) (FIG. 7). The next 11 bits allow a "pin clock" condition to be set up whereby a clock may be applied to the UUT directly through driver 24 for any count up to 2048. Any one of the 7 clocks may be selected under program control and applied to any channel (pin) or any number of channels.

The algorithmic pattern generation (APG) sequence is set up prior to test. Walking ones may be the first standard set in the sequence, walking zeros the second, checkerboard the third, and so on. When the APG code is read from the clock/delay/APG word, predetermined APG sequence number one is initiated. It proceeds on its own, finishes, and upon finishing generates an interrupt to return control to the next word.

FIG. 7 is a block diagram showing clock/delay and algorithmic pattern generator ("APG") subsystem 20. When the system is operating in the functional digital mode, clocks 76 are programmed to generate stimuli of specific frequencies, pulse widths, etc., and also to strobe the test signals to the UUT. There are seven clocks available in the present configuration which may be used to control one or more UPE channels. These clocks may be synchronized among themselves or with any UUT clock, and can be coordinated to account for UUT internal propagation delay (i.e., the time between the application of an input bit and the generation of the resultant output).

In the analog or parametric digital modes, the clocks are used to strobe stimulus data to the UUT via local memory 14, D/A converter 18 and driver 24. In these modes, clocks 76 also serve to strobe UUT output data via receiver 26 to the A/D converters 28, 34 and finally to local memory 14.

Optionally, each receiver 26 is capable of accepting a clock output from the UUT and, under program control, assigning it to any one of the seven clock control lines. In this way, the test situation is controlled by the UUT clock.

APG 78 is capable of generating standard test patterns, for example, to test UUT memory, without the requirement for storing the standard algorithms in local memory 14.

The foregoing detailed discussion of the several available word formats and types of stimuli/measurements facilitates the following description of the overall system architecture.

The overall system functions are controlled by backplane microcontroller 80 as shown in FIG. 8. Microcontroller 80 is programmed to accept input from the user, to translate the user or test station commands into a series of operating commands for transmission to the individual channel boards, clocks 76 and algoithmic pattern generator 78, and then to read data from the individual channel boards, interpret the same and transmit the results to the user or test station.

FIG. 9 shows the operation of I/O interface 68 which serves to make the UPE system compatible with the IEEE 488-198 bus which is the link to the main controller. Interface 68 is under the control of the backplane microcontroller 80 and interface 12 also provides any buffering necessary to eliminate local timing problems.

Signal conditioner 82 provides the electrical and mechanical compatibility with the I/O bus. Buffer 84 includes temporary storage necessary to synchronize data flow between the UPE system and the main controller to avoid timing problems. Among the data which may be directed through interface 68 to local memory 14 are absolute data (i.e. apply/expect, bidirectional control and mask bits for functional digital testing); compacted data (in the optional compaction mode) for functional digital testing; and digital descriptions of the analog and parametric digital stimuli to be generated by local microcontroller 12.

Examples of data output from the UPE system to the main controller are results of the analog and parametric digital signal analysis performed by local microcontroller 12; functional digital test results; guided probe or fault signature diagnostic data (see FIG. 11); results of APG testing and status data.

FIG. 10 shows the flow of data from local memory 14. When the given UPE channel is in its basic word format mode, local memory 14 is filled prior to testing with absolute data, including the apply/expect bit, the bidirectional bit and the mask bit. Data describing the use of clocks 76 controling application of APG 78 are also included.

If the optional decompaction mode is utilized for functional digital testing, the compacted data for use in this mode will also be stored in local memory 14.

In the analog and parametric digital stimulus modes, memory 14 contains the digital equivalent of the patterns which will be directed to the D/A converter 18 which will, in turn convert the same to analog and parametric digital wave forms for application to the UUT.

In the analog and parametric digital measurement modes, local memory 14 is filled with the digitized equivalents of the output from the UUT, which have been converted by use of A/D converters 28 or 34. Digitized data from local microcontroller 12 is also input into local memory 14, all through or gate 86.

The output of local memory 14 may be directed to decoder/frequency multiplier 50 in the functional digital mode, to optional decompaction module 40 for the compacted functional digital mode, to D/A converter 18 for analog or parametric digital stimulus or to local microcontroller 12.

Finally, UPE system constructed in accordance with the present invention incorporates two principal approaches to fault isolation; namely, a guided probe/clip and a fault signature/fault dictionary.

Guided probe 88 (see FIG. 11) requires the test system operator to direct the placement of a special probe on a given point on the UUT, or of a multi-point probe on a given integrated circuit. Data from the probe locations are analyzed by the probe software and compared with "good board" data.

In contrast, the fault dictionary is a software tool which is typically constructed by running a logic simulation; and for each simulated fault, the test step where the failure is first detected and the input/output pin states at that step are compared to accumulated data to determine if it differs from the "good machine."

The several previously described components and subcomponents have been designed to perform in accordance with the system parameters shown in the following schedule.

SCHEDULE OF SYSTEM PARAMETERS

| OVERALL SYSTEM SPECIFICATION | |
|---|---|
| General | |
| Maximum Functional Digital Repetition Frequency | 100 MHz |
| Maximum Parametric Digital Stimulus/Measurement Rate | 20 MHz |
| Maximum Analog Stimulus/Measurement Rate | 20 MHz |
| Maximum Pin Count Per Chassis | 256 channels, 512 UUT pins |
| Driver Output Range | +−10 V |
| Receiver Input Range | +−10 V |
| Driver Output Resistance | 1 OHM or 50 OHMs |
| Receiver Input Resistance | 1 MEGOHM MIN. |
| Receiver Input Capacitance | 10 pF MAX. |
| Crosstalk Between Pins | 60 dB MIN. |
| Receiver Input Voltage Protection | +−20 V |
| Driver Source/Sink Current | +−50 ma |
| Functional Digital | |
| Maximum Driver/Receiver Skew | +−1 ns |
| Driver Slew Rate | 1 v/ns |
| Minimum Vector Depth (standard) | 20K (8K tri-state) |
| Minimum Vector Depth (compacted) | 250K |
| Minimum Driver Tristate Impedance | 100K OHMs |
| Simultaneous Logic Families | Unlimited |
| Driver Accuracy | 1% |
| Driver Resolution | 80 mV |
| Driver Overshoot | 10% no load |
| Receiver Accuracy | 1% |
| Receiver Resolution | 80 mV |
| Receiver Input Levels (standard) | 2 |
| Receiver Input Levels (optional) | 4 |
| Pull-up Load Resistor | One per channel |
| Pull-down Load Resistor | One per channel |
| Number of Clock/delays | 7 |
| Number of Clock/delay Edges | 14 |
| Clock/delay Range | 1 Hz to 100 MHz |
| Clock/delay Strobe Resolution | 0.5 ns |
| Clock Modes | Asynchronous, synchronous to other clocks &/or to UUT, or external |
| Algorithmic Patterns | Walking one, Walking zero, checkerboard, inverted checkerboard |
| Analog/Parametric Digital | |
| Time Resolution | 1 part in 4096 Max. |
| Sampling Rate | 60 MHz Max. |
| Waveform Stimulus Types | Sine, square, pulse train, triangle, ramp |
| Stimulus Range | +−10 V |
| Stimulus Accuracy | 1% |
| Stimulus Resolution | 80 mV |
| Waveform Measurement Parameters | Risetime, falltime, pulse-width, dc voltage, peak voltage, RMS voltage, frequency, period, delay, phase shift, events |
| Measurement Range | +−10 V per channel (+−50 V, +−100 V, +−200 V per group, 16 bit resolution) |
| Measurement Accuracy | 1% |
| Measurement Resolution | 80 mV, 10 V range (16 bit resolution on higher ranges) |

ENVIRONMENTAL

The unit shall meet the environmental requirements of MIL-T-28800, Class 4 equipment Style F except as modified below.

TEMPERATURE RANGE

Operating

The operating temperature range shall be 10 degrees C. to 50 degrees C.

Nonoperating

The non-operating temperature range shall be −40 degrees C. to 70 degrees C.

RELATIVE HUMIDITY

Operating

The operating relative humidity profile shall be:
a. from 3% to 95% (+5−0), with no condensation, to 27 degrees C.
b. from 8% to 74% at 35 degrees C.
c. from 3% to 25% at 45 degrees C.
d. from 3% to 20% at 50 degrees C.
e. from 3% to 10% at 60 degrees C.

Non Operating

The non-operating relative humidity profile shall be:
a. 100% with condensation, to 24 degrees C. to
b. 75% at 35 degrees C. decreasing to
c. 30% at 50 degrees C. decreasing to
d. 10% at 75 degrees C.

Units may be conditioned, prior to normal operation, by removal of excess moisture and a drying out period after being subjected to conditions of condensation.

Altitude

Operating to 15,000 feet, non-operating to 40,000 feet.

Vibration

Operating, not applicable. Non-operating vibration shall be in accordance with MIL-STD-810, method 514.2, Equipment Category G, Procedure X, as follows: 2G at 5 Hz and increasing to 5G at 12 Hz, decreasing to 2G to 50 Hz and remaining at 2G to 200 Hz.

Shock

The non-operating shock requirements shall be half-sine 30g shock pulse in accordance with MIL-STD-810, Method 516.2, Procedure I, FIG. 516.2-2.

Fungus-Inert Materials

Fungus-inert materials shall be used in accordance with MIL-STD-454, Requirement 4.

| I/O INTERFACE SPECIFICATION | |
|---|---|
| System Interface | Compatible with IEEE std. 480-1978 (488 compatible cable to be included) |
| Transfer Rate | 0 to 500K bytes per second |
| Bus Address | Program Controllable |

Power Supply voltage and internal interface levels, fan-out capability, etc. must be consistent with overall system design Operating temperature range and maximum power dissipation must be such that the overall environmental specification are achieved.

| LOCAL MEMORY SPECIFICATION | |
|---|---|
| Organization | |
| Words | 2K minimum |
| Bits per word | 16 |
| Maximum Access Time | 33 ns |
| Maximum Write Cycle Time | 33 ns |
| Parity | Not required |

Input/output (I/O) levels should be compatible with other elements in the channel. This and many other important memory characteristics cannot be determined in an optimal fashion until detailed design work is initiated. The mode selected (dynamic, static) and actual technology are best determined during the design phase. Other parameters such as operating temperature range, operating power dissipation, and physical dimensions are also best selected during this phase. They should be optimized so as to meet the overall environmental and operating requirements for the pin electronics. For example, the actual design configuration will have a profound effect on the memory operating temperature range. The memory has to coexist with other tightly packaged heat producing components so that the entire UPE channel will be operable within its required temperature envelope. When a channel is not in use, the local memory should be placed in a deselect state so as to minimize power dissipation.

| D/A CONVERTER AND LOGIC LEVEL GENERATOR SPECIFICATION | |
|---|---|
| D/A Converter | |
| Input Format | 8 bits |
| Input Levels | Compatible with overall system design |
| Output Voltage Range | Such that overall system specifications are met |
| Output Current | |
| Output Voltage Accuracy | |
| Maximum Settling Time | 16.67 ns |
| Maximum Power Dissipation | Selected so that final design of UPE meets overall environmental specifications |
| Operating Temperature Range | environmental specifications |
| Power Supply | Compatible with overall system design |
| Logic Level Generator | |
| Input Format | Four 8 bit words (VD1, VD0, VR1, VR0) |
| Optional Input Format | Above plus 2 additional 8 bit words (VR11, VR00) |
| Output Format | Analog voltage +−10 V for each of VD1, VD0, VR1, VR0 |

*-continued*

| D/A CONVERTER AND LOGIC LEVEL GENERATOR SPECIFICATION | |
|---|---|
| Optional Output Format | Above plus analog voltage +−10 V for each of VR11 and VR00 |
| Output Voltage Accuracy | Selected such that overall system specifications are met |
| Output Voltage Resolution | 80 mV |
| Multiplexer Sampling Rate | Commensurate with output voltage requirement |

| DECODER/FREQUENCY MULTIPLIER SPECIFICATION | | | |
|---|---|---|---|
| Input Word | 16 bits from Local Memory | | |
| Output Format | TRISTATE | INPUT OR OUTPUT | INPUT AND OUTPUT |
| BIT 1 | A/E | A or E | A |
| 2 | B | " | E |
| 3 | M | " | M* |
| 4 | A/E | " | A |
| 5 | B | " | E |
| 6 | M | " | M* |
| 7 | A/E | " | A |
| 8 | B | " | E |
| 9 | M | " | M* |
| 10 | A/E | " | A |
| 11 | B | VR | E |
| 12 | M | VR | M* |
| 13 | VR | VR | VR |
| 14 | VR | VR | VR |
| 15 | *1 | *1 | *1 |
| 16 | *1 | *1 | *1 |

VR: Valid Reads
*Optional
*1 Clock, absolute or compacted next word
Maximum Input Rate   30 MHz
Maximum Output Rate  100 MHz
Logic Levels            System Compatible

| DECOMPACTION MODULE SPECIFICATION | | |
|---|---|---|
| Input Format 1 | Bits 1, 2, 3 | One of eight patterns |
| | Bits 4 through 14 | One to 2048 counts |
| | Bits 15 and 16 | Basic, clock or compacted next word |
| Input Format 2 | TBD | |
| Output Format | Alternating, serial 2048 bit maximum registers | |
| Input Frequency | 30 MHz maximum | |
| Output Frequency | 100 MHz maximum | |
| Power Supply Voltage I/O Levels | Selected to be consistent with overall system design | |
| Operating Temperature Range | Selected such that overall environmental specifications are achieved | |
| Maximum Power Dissipation | | |

| FUNCTIONAL DIGITAL SUBSYSTEM SPECIFICATION | |
|---|---|
| Maximum Functional Digital Repetition Frequency | 100 MHz |
| Minimum Vector Depth (standard) | 20K (8K tri-state) |
| Minimum Vector Depth (compacted) | 250K |
| Simultaneous Logic Families | Unlimited |
| Crosstalk Between Pins | 60 dB MIN. |
| Driver Output Range | +−10 V |
| Driver Output Resistance | 1 OHM MAX. (Short-Circuit Proof) |
| Driver Source/Sink Current | +−50 ma |
| Maximum Driver Skew | +−1 ns |
| Driver Slew Rate | 1 v/ns |
| Minimum Driver Tristate Impedance | 100K OHMs |
| Driver Accuracy | 1% |
| Driver Resolution | 80 mV |
| Driver Overshoot | 10% no load |
| Receiver Input Range | +−10 V |
| Receiver Input Voltage Protection | +−20 V |
| Receiver Input Resistance | 1 MEGOHM MIN. |
| Receiver Input Capacitance | 10 pF MAX. |
| Maximum Receiver Skew | +−1 ns |
| Receiver Accuracy | 1% |
| Receiver Resolution | 80 mV |
| Receiver Input Levels (standard) | 2 |
| Receiver Input Levels (optional) | 4 |
| Pull-up Load Resistor | One per channel |
| Pull-down Load Resistor | One per channel |

| DRIVER/RECEIVER SPECIFICATION | |
|---|---|
| Driver Input Signals | Pin Clock, APG, D/A Converter, Func. Digital Subsystem; programmed Logic Level signals |
| Driver Output Signal | To UUT |
| Receiver Input Signal | From UUT |
| Receiver Output Signals | Channel 8 bit A/D, Func. Digital Level Comparator, Clock Interface |
| Maximum Functional Digital Repetition Frequency | 100 MHz |
| Maximum Parametric Digital Stimulus/Measurement Rate | 20 MHz |
| Maximum Analog Stimulus/ Measurement Rate | 20 MHz |
| Driver Output Range | +−10 V |
| Driver Output Resistance (Functional Digital) | 1 OHM |
| Driver Output Resistance (Analog/Parametric Digital) | 50 OHMs |
| Driver Source/Sink Current | +−50 ma |
| Driver Slew Rate | 1 v/ns |
| Minimum Driver Tristate Impedance | 100K OHMs |
| Driver Accuracy | 1% |
| Driver Overshoot | 10% no load |
| Maximum Driver/Receiver Skew | +−1 ns |
| Receiver Input Range | +−10 V |
| Receiver Input Voltage Protection | +−20 V |
| Receiver Input Resistance | 1 MEGOHM MIN. |
| Receiver Input Capacitance | 10 pF MAX. |
| Receiver Accuracy | 1% |

| CLOCKS/DELAYS/APG SPECIFICATION | |
|---|---|
| Number of clock/delays | 7 |
| Number of clock/delay edges | 14 |
| Clock/delay range | 1 Hz to 100 MHz |
| Clock/delay strobe resolution | 0.5 ns |
| Clock/delay jitter | 0.5 ns |
| Clock Modes | Asynchronous, synchronous to other clocks &/or to UUT, or external |
| Algorithmic Patterns | Walking one, walking zero, checkerboard, inverted checkboard |
| APG address width | 8 standard, 16 optional |
| APG data width | 8 standard, 16 optional |
| Power Supply Voltage | Selected to be consistent with overall system design |
| Internal Interface Operating Temperature Range | Selected such that overall environmental specifications are achieved |
| Maximum power dissipation | |

| A/D CONVERTERS SPECIFICATION | | |
|---|---|---|
| | CHANNEL A/D | GROUP A/D |
| Input Voltage Ranges | +−10 V +−50 V, | +−10 V, +−100 V, +−200 V |
| Resolution (bits) | 8 | 16 |
| Max. Conversion Time | 16.7 ns | 20 us |
| Output Levels | | Compatible with overall system design |
| Maximum Power Dissipation | | Selected so that when overall design is complete, system meets overall environmental specifications |
| Operating Temperature Range | | |
| Power Supply | | |

What is claimed is:

1. A system for the automatic testing of a unit under test having a plurality of pins, said system including a plurality of test channels each coupled to a single pin of said unit capable of functioning as an input pin and a single pin of said unit capable of functioning as an output pin, at least one of said test channels being adapted to be coupled to selectively apply analog, parametric digital and functional digital stimuli to a said single pin capable of functioning as an input pin and to receive an induced response from a said single pin capable of functioning as an output pin, at least one of said channels comprising: a local memory for storing digital information in response to which said stimuli are generated, a driver adapted to be coupled to said single pin capable of functioning as an input pin, a receiver adapted to be coupled to said single pin capable of functioning as an output pin, means including a digital to analog converter coupled to said memory and to said driver to provide analog stimuli to said driver based on digital information read from said memory, means coupled to said memory and to said driver for receiving digital information from said memory and providing functional digital and parametric digital stimuli to said driver, means including an analog to digital converter coupled to said receiver and to said memory for storing digital information in said memory based on analog responses received from said single pin capable of functioning as an output pin, means coupled to said receiver for receiving via said receiver functional digital and parametric digital responses from said single pin capable of functioning as an output pin and to said memory for receiving digital information therefrom relating to expected responses and for comparing expected responses with received responses, and timing means coupled to said memory, to said analog stimuli providing means, to said functional and parametric digital stimuli providing means, to said storing means and to said comparing means for timing and controlling the same.

2. The system according to claim 1 wherein said driver and said receiver of said test channel are coupled to a common single pin capable of functioning as an input pin, an output pin or a bidirectional pin, said memory storing digital information relating to the function of said common pin, said system including means for selectively enabling said driver and said receiver in response to said digital information relating to the function of said common pin.

3. The system according to claim 1 wherein said functional and parametric digital providing means includes means for varying the level of parametric digital stimuli.

4. The system according to claim 1 wherein said comparing means includes means for comparing the level of expected parametric responses with predetermined levels.

5. The system according to claim 1 wherein said memory stores compacted digital information and said functional and parametric digital providing means includes a decompaction module for receiving compacted digital information from said memory and providing functional digital stimuli in response thereto.

6. A system for selectively generating analog and parametric digital signals for application to a unit under test having a plurality of pins, said system including a plurality of test channels, each of said test channels being adapted to be coupled to apply the respective selectively generated analog or parametric digital signal to a different single pin of said unit, each said test channel comprising: a memory for storing respective 16-bit digital word equivalents of respective analog and parametric digital signals; a splitter coupled to said memory to receive and divide 16-bit digital word equivalents read from said memory into two 8-bit digital words; at least one digital to analog converter coupled to said splitter for converting respective 8-bit digital words to respective analog and parametric digital signals; means for timing said memory to read said 16-bit digital word equivalents therefrom and for timing said digital to analog converter to convert said 8-bit digital words into said analog and parametric digital signals; and means for applying the respective selectively generated analog and parametric digital signals to a said different pin of said unit.

7. A system for selectively measuring analog and parametric digital output signals of a unit under test having a plurality of pins, said system including a plurality of test channels, each of said test channels being adapted to be coupled to receive said analog and parametric digital signals from a different single pin of said unit, each said test channel comprising: a receiver adapted to be coupled to a said different pin of said unit for receiving analog and parametric digital output signals; an analog to digital converter coupled to said receiver for converting respective analog and parametric digital output signals to respective 8-bit digital word equivalents; combining means coupled to said analog to digital converter for concatenating two respective 8-bit digital words from said analog to digital converter to form respective 16-bit digital words; a memory coupled to said combining means for receiving and storing 16-bit digital words formed by said combining means, and means for timing said analog to digital converter to convert said analog and parmaetric digital signals to said 8-bit digital words and for timing said memory to store said 16-bit digital words.

8. A system for generating functional digital signals for application to a unit under test having a plurality of pins, said unit having a pin capable of functioning as an input pin or a bidirectional pin, said system including at least one test channel adapted to be coupled exclusively to said pin comprising: a memory for storing digital words containing information relating to the function of said pin and relating to functional digital signals; buffer means coupled to said memory for receiving digital words read from said memory; means coupled to said buffer means for receiving a digital word therefrom and for generating one or more digital vectors from said digital word, at least one of said vectors including information as to the function of said pin and at least one of said vectors including a functional digital signal; a driver for applying said functional digital signal to said pin; and means for enabling said driver in response to a vector which indicates that said pin is an input pin or in response to a vector which indicates that said pin is a bidirectional pin and a vector including a functional digital signal.

9. The system according to claim 8 wherein said pin is also capable of functioning as an output pin, said system including a receiver adapted to be coupled to receive an induced response from said pin and means for enabling said receiver in response to a vector which indicates that said pin is an output pin or a bidirectional pin.

10. The system according to claim 9 wherein said memory stores digital words containing information relating to the function of said pin and relating to expected responses, said receiving and generating means generating one or more digital vectors from digital words which include pin function information and expected response information, at least one of said vectors including information as to the function of said pin and at least one of said vectors including an expected response, said enabling means enabling said receiver in response to a vector which indicates that pin is an output pin or in response to a vector which indicates that said pin is a bidirectional pin and a vector including an expected response.

11. The system according to claim 10 including means for comparing an induced response with an expected response, said comparing means being coupled to receive an induced response from said receiver and a vector including an expected response.

12. The system according to claim 8 including means for varying the level of said functional digital signal.

13. A system in accordance with claim 12 wherein said means for varying the level of said functional digital signal includes an auxiliary memory for storing digital words, a digital to analog converter coupled to said auxiliary memory for converting digital words read from said auxiliary memory to equivalent analog signals, means for timing said memory to read digital words therefrom and for timing said digital to analog converter to convert digital words to analog signals, and one or more buffer amplifiers coupled to said digital to analog converter for receiving said analog signals and for applying the same to said driver.

14. A system for measuring functional digital output signals of a unit under test having a plurality of pins, said system including a plurality of test channels, each of said test channels being adapted to be coupled to receive functional digital output signals from a different single pin of said unit, each said test channel comprising: a receiver adapted to be coupled to a different pin of said unit for receiving functional digital output signals; logic comparison means coupled to said receiver for receiving a respective functional digital output signal for comparing the same to a respective predetermined logic level and providing error signals when respective digital output signals and predetermined logic levels are not the same; and level comparison means coupled between said receiver and said logic comparison means for comparing the level of a respective functional digital signal to a respective predetermined value.

15. A system in accordance with claim 14 including error logging means coupled to said logical comparison means for receiving error signals from said logic comparison means and storing the same.

16. A system for generating functional digital signals for application to a unit under test having a plurality of pins, said unit having a pin capable of functioning as an input pin or a bidirectional pin, said system including at least one test channel adapted to be coupled exclusively to said pin comprising: a memory for storing digital words in compacted form containing information relating to the function of said pin and relating to functional digital signals; a decompaction module for receiving said digital words in compacted form read from said local memory and converting the same to decompacted words; register means coupled to said decompaction module for receiving said decompacted words therefrom and for generating one or more digital vectors from said decompacted words, at least one of said vectors including information as to the function of said pin and at least one of said vectors including a functional digital signal; a driver for applying functional digital signals from said register means to said pin; and means for enabling said driver in response to a vector which indicates either that said pin is an input pin or in response to a vector which indicates that said pin is a bidirectional pin and a vector including a functional digital signal.

17. The system according to claim 16 wherein said pin is also capable of functioning as an output pin, said system including a receiver adapted to be coupled to receive an induced response from said pin and means for enabling said receiver in response to a vector which indicates that said pin is an output pin or a bidirectional pin.

18. The system according to claim 17 wherein said local memory stores digital words containing information relating to the function of said pin and relating to expected responses, said register means generating one or more digital vectors from digital words which include pin function information and expected response information, at least one of said vectors including information as to the function of said pin and at least one of said vectors including an expected response, said enabling means enabling said receiver in response to a vector which indicates that said pin is an output pin or in response to a vector which indicates that said pin is a bidirectional pin and a vector including an expected response.

19. The system according to claim 19 including means for comparing an induced response with an expected response, said comparing means being coupled to receive an induced response from said receiver and a vector including an expected response.

20. The system according to claim 16 wherein said register means comprises two registers and means for timing each of said registers to alternately receive digital words and output vectors, one register being timed to be capable of receiving digital words while the other register is timed to be capable of outputing vectors.

21. A system for selectively generating analog and parametric digital signals for application to a unit under test having a plurality of pins, and for selectively measuring analog and parametric digital output signals of said unit under test, said system including at least one test channel adapted to be coupled to a single pin of said unit functioning as an input pin for selectively applying analog and parametric digital signals thereto and to a single pin of said unit functioning as an output pin for receiving analog and parametric digital signals therefrom, said at least one test channel comprising: a memory for storing 16-bit digital word equivalents of analog and parametric digital signals; a splitter coupled to said memory to receive and divide respective 16-bit digital word equivalents read from said memory into respective two 8-bit digital words; at least one digital to analog converter coupled to said splitter for converting respective 8-bit digital words received from said digital to analog converter to respective analog and parametric digital signals; means for applying respective analog and parametric digital signals to said single pin functioning as an input pin; a receiver adapted to be coupled to said single pin functioning as an output pin to receive said analog and parametric digital output signals; an analog to digital converter coupled to said receiver for converting respective analog and parametric digital output signals received from said receiver to respective 8-bit digital word equivalents; combining means coupled to said analog to digital converter for concatenating two respective 8-bit digital words from said analog to digital converter to form a respective 16-bit digital words; said memory being coupled to said combining means for receiving and storing said 16-bit digital words, and means for timing said memory to read 16-bit words therefrom, for timing said digital to analog converter to convert 8-bit digital words to analog and parametric digital signals and for timing said analog to digital converter to convert analog and parametric digital signals to 8-bit digital word equivalents.

22. A system for generating functional digital signals for application to a unit under test having a plurality of pins and for measuring functional digital output signals at the output of said unit, said unit having a pin capable of functioning as an input pin, an output pin or a bidirectional pin, said system including at least one test channel adapted to be coupled exclusively to said pin, each of said test channels comprising: a memory for storing digital words; buffer means coupled to said memory for receiving respective digital words read from said memory; means coupled to said buffer means for receiving said respective digital words therefrom and for generating one or more digital vectors from said digital words, at least one of said words including at least one vector including information as to the function of said pin and at least one vector including a functional digital signal, and at least one of said words including at least one vector including information as to the function of said pin and at least one vector including predetermined logic levels; a driver for applying functional digital signals generated by said generating means to said at least one pin; means for enabling said driver in response to a vector which indicates that said pin is an input pin, or in response to a vector which indicates that said pin is a bidirectional pin and a vector including a functional digital signal, a receiver adapted to be coupled to said pin for receiving said functional digital output signals; means for enabling said receiver in response to a vector which indicates that said pin is an output pin or in response to a vector which indicates that said pin is a bidirectional pin and a vector including predetermined logic levels; and logical comparison means coupled to said receiver for comparing respective functional digital signals output by said receiving means to respective predetermined logic levels.

* * * * *